(12) United States Patent
Kodaira (10) Patent No.: US 9,941,254 B2
(45) Date of Patent: Apr. 10, 2018

(54) SEMICONDUCTOR DEVICE

(71) Applicant: FUJI ELECTRIC CO., LTD., Kawasaki-shi, Kanagawa (JP)

(72) Inventor: Yoshihiro Kodaira, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/470,220

(22) Filed: Mar. 27, 2017

(65) Prior Publication Data

US 2017/0200704 A1  Jul. 13, 2017

Related U.S. Application Data

(63) Continuation of application No. PCT/JP2016/059201, filed on Mar. 23, 2016.

(30) Foreign Application Priority Data

Apr. 10, 2015  (JP) .................... 2015-081207

(51) Int. Cl.
| H01L 23/10 | (2006.01) |
| H01L 23/16 | (2006.01) |
| H01L 25/07 | (2006.01) |
| H01L 25/18 | (2006.01) |

(52) U.S. Cl.
CPC .............. *H01L 25/07* (2013.01); *H01L 25/18* (2013.01); *H01L 23/10* (2013.01); *H01L 23/16* (2013.01)

(58) Field of Classification Search
CPC .................................. H01L 23/10; H01L 23/16
USPC ......................................................... 257/727
See application file for complete search history.

(56) References Cited

U.S. PATENT DOCUMENTS

| 5,243,217 A * | 9/1993 | Yamada ................. H01L 23/24 257/692 |
| 6,262,474 B1 | 7/2001 | Kobayashi et al. |
| 6,597,585 B2 | 7/2003 | Ferber et al. |
| 2013/0334676 A1* | 12/2013 | Kodaira ............... H01L 23/142 257/690 |

(Continued)

FOREIGN PATENT DOCUMENTS

| JP | H04-242965 A | 8/1992 |
| JP | H05-15445 U | 2/1993 |

(Continued)

OTHER PUBLICATIONS

PCT/ISA/210, "International Search Report for International Application No. PCT/JP2016/059201," dated May 24, 2016.

*Primary Examiner* — George Fourson, III
(74) *Attorney, Agent, or Firm* — Manabu Kanesaka (57) ABSTRACT

A semiconductor device 10 includes: multi-layered substrates 12 each having a circuit board 12c; control terminals 14 whose one end is fixed on the circuit board 12c of each multi-layered substrate 12; a resin case 15 which has openings 20 and is arranged to cover the multi-layered substrates 12, through which openings 20 the other ends of the control terminals 14 extend outwardly; and resin blocks 18 which are each inserted into the openings 20 of the resin case 15 and press-fixes the control terminals 14 against the side walls of the respective openings 20. The control terminals 14 each have a low-rigidity portion 14j at a position that is further interior of the resin case 15 than a position where each control terminal 14 is in contact with the resin block 18 in the respective openings 20 of the resin case 15.

6 Claims, 10 Drawing Sheets

(56) References Cited

U.S. PATENT DOCUMENTS

| | | | | |
|---|---|---|---|---|
| 2014/0168922 A1* | 6/2014 | Kodaira | ................ | H01L 25/072 361/773 |
| 2015/0235965 A1* | 8/2015 | Kodaira | ................ | H01L 23/544 438/118 |
| 2016/0225685 A1* | 8/2016 | Kodaira | ................ | H01L 23/053 |
| 2017/0018480 A1* | 1/2017 | Shigeta | ................... | H01L 25/07 |

FOREIGN PATENT DOCUMENTS

| | | |
|---|---|---|
| JP | H11-345926 A | 12/1999 |
| JP | 2000-208686 A | 7/2000 |
| JP | 2005-123328 A | 5/2005 |
| JP | 2009-010252 A | 1/2009 |
| JP | 2014-107378 A | 6/2014 |
| WO | 2013/027826 A1 | 2/2013 |

* cited by examiner

SEMICONDUCTOR DEVICE

CROSS-REFERENCE TO RELATED APPLICATIONS

This application is a continuation of PCT Application No. PCT/JP2016/059201, which claims priority to Japanese Patent Application No. 2015-081207, filed Apr. 10, 2015. The contents of these applications are incorporated herein by reference in their entirety.

TECHNICAL FIELD

The present invention relates to a semiconductor device.

BACKGROUND ART

With regard to power semiconductor modules, there are ones in which a semiconductor chip(s) is/are fixed on a circuit board of a multi-layered substrate and a main terminal(s) and a control terminal(s) are each fixed on the circuit board at one end, with the other end penetrating through an opening provided on a resin case and extending outwardly therefrom. Such main terminals and control terminals that are not integrated with a resin case by insert molding, in other words, terminals that are provided independently of a resin case, are called "independent terminals".

Figure 8A:
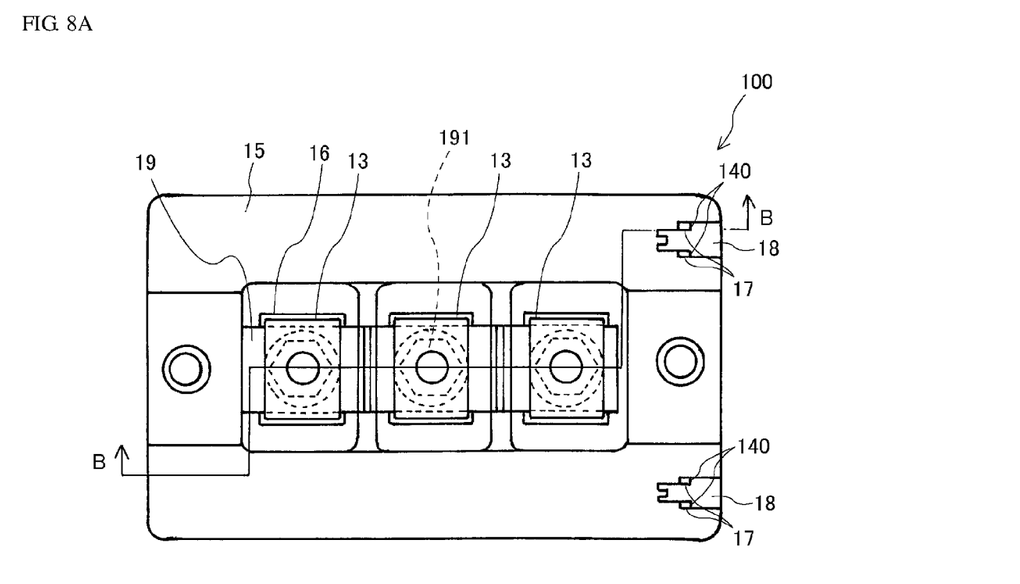
FIGS. 8A to 8D are drawings that illustrate a conventional power semiconductor module.
Figure 8B:
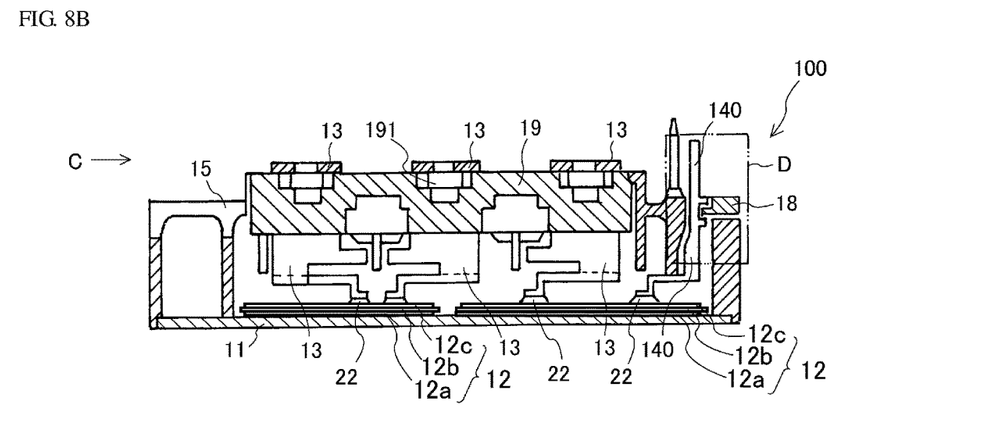

A power semiconductor module comprising independent terminals is described in Patent Document 1. FIG. 8A is a plan view of the power semiconductor module described in Patent Document 1, and FIG. 8B is a cross-sectional view of FIG. 8A taken along the line B-B. In a power semiconductor module 100 shown in FIGS. 8A and 8B, multi-layered substrates 12 are fixed on a heat-dissipating base 11 by a bonding material (not shown) such as a solder. Each multi-layered substrate 12 is constituted by a metal plate 12a, an insulating plate 12b and a circuit board 12c, which are laminated with each other. In one region of the circuit board 12c of the multi-layered substrate 12, the lower end of a main terminal 13 is bonded electrically and mechanically by a solder 22. Further, in other region of the circuit board 12c, the lower end of a control terminal 140 is bonded electrically and mechanically by the solder 22. A resin case 15 is arranged in such a manner as to cover the multi-layered substrates 12 and fixed on the heat-dissipating base 11 using an adhesive (not shown).

Figure 8C:
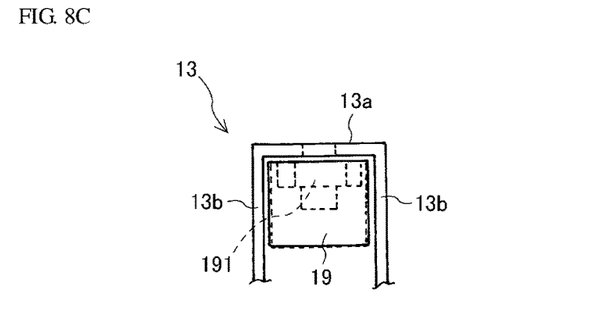

FIG. 8C is an enlarged view showing the principal part of each main terminal 13 in the vicinity of its upper end, which is taken in the direction of C as indicated in FIG. 8B. The upper end of the main terminal 13 has an inverted U-shape formed by an upper surface portion 13a and two side surface portions 13b connected to each end of the upper surface portion. The upper end of the main terminal 13 extends outwardly through an opening 16 of the resin case 15. Between the two side surface portions 13b of the main terminal 13, a nut case 19, which is a resin body having a nut 191 embedded therein, is inserted.

Figure 8D:
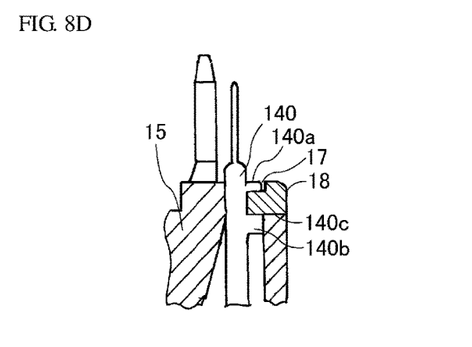

FIG. 8D is an enlarged view showing the vicinity of a region D of FIG. 8B, that is, an enlarged view showing the vicinity of the upper end of each control terminal 140. The upper end of the control terminal 140 extends outwardly through an opening 17 of the resin case 15. The control terminal 140 has a first protrusion 140a and a second protrusion 140b, which are spaced from each other. Between the first protrusion 140a and the second protrusion 140b, a recess 140c is formed.

A resin block 18, which has a convex step that fits into the recess 140c of the control terminal 140, is inserted into the opening 17 of the resin case 15 for the control terminal 140. The recess 140c is engaged with a tip of the resin block 18. This allows the control terminal 140 to be precisely positioned in the horizontal direction and the movement thereof in the vertical direction caused by an external load to be inhibited.

The upper end of the control terminal 140 requires a high positional accuracy since it is connected to a connector or a printed circuit board. Particularly, the control terminal 140, which is an independent terminal, may have a lower positional accuracy than a control terminal insert-molded in the resin case 15. Therefore, it has been tried to improve the positional accuracy by engaging the control terminal 140 with the resin block 18 as shown in FIG. 8D.

However, the positioning accuracy of the upper end of the control terminal 140 may be reduced depending on the positional accuracy in bonding of the lower end of the control terminal 140 to the circuit board of the multi-layered substrate 12. In addition, from the standpoints of the tolerance of the control terminal 140 and the workability in fixation of the resin case 15, a clearance is provided between the opening 17 of the resin case 15 and the control terminal 140 passed through the opening 17. When this clearance is large, the positioning accuracy of the control terminal 140 may be deteriorated.

RELATED ART DOCUMENT

Patent Document

Patent Document 1: WO 2013/027826

SUMMARY OF THE INVENTION

Problems to be Solved by the Invention

The present invention advantageously solves the above-described problems, and an object of the present invention is to provide a semiconductor device in which the positioning accuracy of a control terminal, which is an independent terminal, can be improved.

Means for Solving the Problems

According to one mode, the semiconductor device of the present invention comprises: a multi-layered substrate which comprises a circuit board; a control terminal which has an end on one side and the other end on the other side, the end on one side being fixed on the circuit board of the multi-layered substrate; a resin case which has an opening and is arranged to cover the multi-layered substrate, through which opening the other end of the control terminal extends outwardly; and a resin block which is inserted into the opening of the resin case and press-fixes the control terminal against the side wall of the opening. The control terminal comprises a low-rigidity portion at a position that is further interior of the resin case than a position where the control terminal is in contact with the resin block in the opening of the resin case.

Effects of the Invention

According to the above-described mode, since the control terminal comprises a low-rigidity portion, the positioning accuracy of the control terminal, which is an independent terminal, can be improved.

MODE FOR CARRYING OUT THE INVENTION

Embodiments of the semiconductor device of the present invention will now be concretely described referring to the drawings. It is noted here that, in the following descriptions, the terms "upper" and "lower" each mean the vertical positional relationship in the respective drawings, not the vertical positional relationship in the actual use.

Embodiment 1

Figure 1A:
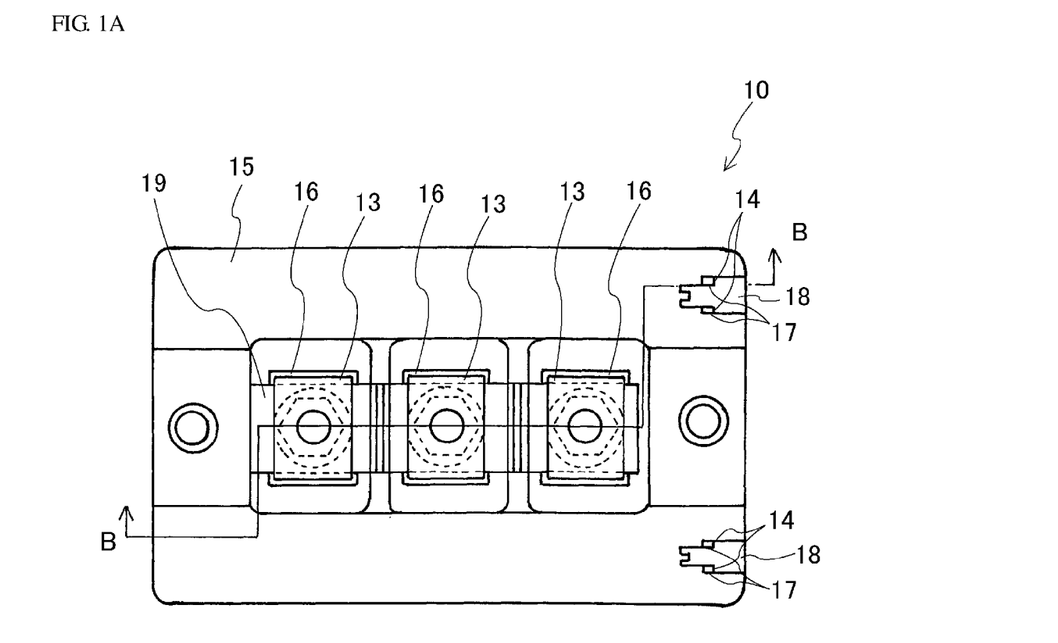
FIGS. 1A to 1D are drawings that illustrate the power semiconductor module of Embodiment 1 of the present invention.
Figure 1B:
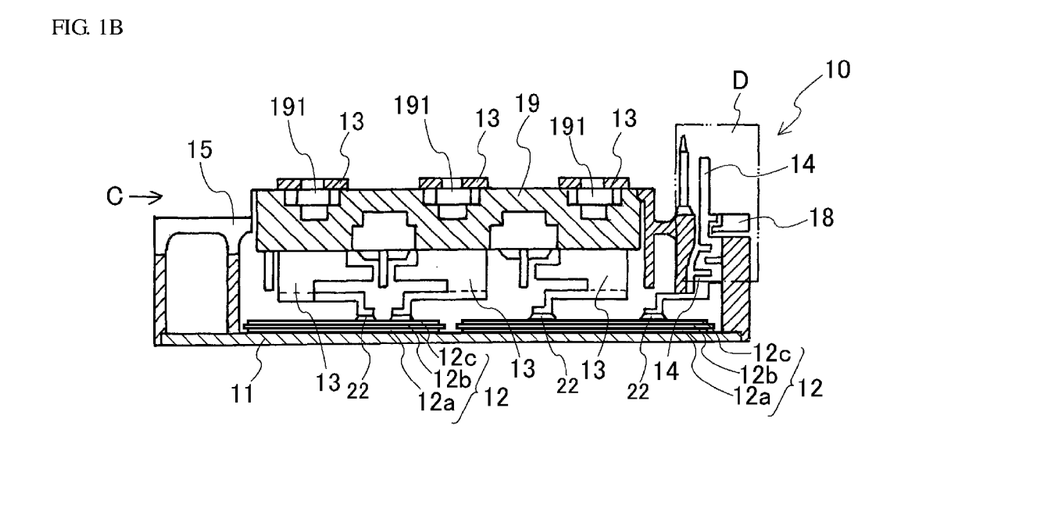

FIGS. 1A and 1B are drawings that illustrate a power semiconductor module 10, which is one embodiment of the semiconductor device of the present invention. FIG. 1A is a plan view of the power semiconductor module 10, and FIG. 1B is a cross-sectional view of FIG. 1A taken along the line B-B. The power semiconductor module 10 comprises: a heat-dissipating base 11; multi-layered substrates 12; main terminals 13; control terminals 14; and a resin case 15.

As shown in FIG. 1B, the multi-layered substrates 12 are fixed on the heat-dissipating base 11. Each multi-layered substrate 12 is constituted by a metal plate 12a, an insulating plate 12b and a circuit board 12c, which are laminated with each other. The multi-layered substrates 12 are each fixed on the heat-dissipating base 11 by a bonding material (not shown) such as a solder, with the metal plate 12a facing the heat-dissipating base 11. The circuit board of each multi-layered substrate 12 is selectively formed to have a pattern that constitutes a prescribed electric circuit. On the circuit board of each multi-layered substrate 12, a power semiconductor chip (not shown) is electrically and mechanically bonded by a bonding material. In FIGS. 1A and 1B, since the power semiconductor chip is not a characteristic part of the present invention, illustration thereof is omitted. In the same manner, illustration of a wiring member that electrically connects the power semiconductor chip with the circuit board 12c is also omitted since the wiring member is not a characteristic part of the present invention. On the circuit boards 12c of the multi-layered substrates 12, the lower ends of the main terminals 13 are electrically and mechanically bonded by soldering, brazing, ultrasonic bonding or welding, and the lower ends of the control terminals 14 are also electrically and mechanically bonded by soldering, brazing, ultrasonic bonding or welding. In the illustrated example, the circuit boards 12c and the lower ends of the main terminals 13 are bonded by a solder 22. The circuit boards 12c and the lower ends of the control terminals 14 are also bonded by the solder 22. The power semiconductor chip is electrically connected to the main terminals 13 and the control terminals 14 via the circuit board of each multi-layered substrate 12 or a wiring member (not shown).

As shown in FIG. 1A, the resin case 15 is arranged in such a manner to cover the multi-layered substrates 12 and fixed on the heat-dissipating base 11 by an adhesive. The resin case 15 has openings 16 and openings 17. The upper ends of the main terminals 13 extend outwardly through the openings 16. Further, the upper ends of the control terminals 14 extend outwardly through the openings 17. In the illustrated example, the openings 17 are provided for three main terminals 13 and four control terminals 14. A resin block 18 is attached in the vicinity of each opening 17 of the resin case 15 for the control terminal 14. The power semiconductor module 10 shown in FIGS. 1A to 1D has an external shape of a substantially rectangular parallelepiped.

Figure 1C:
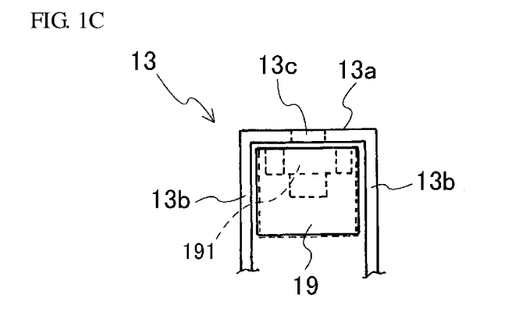

FIG. 1C is an enlarged view showing the principal part of each main terminal 13 in the vicinity of the upper end, which is taken in the direction of C as indicated in FIG. 1B. The upper ends of the main terminals 13 have an inverted U-shape formed by an upper surface portion 13a and two side surface portions 13b connected to each end of the upper surface portion. The upper ends of the main terminals 13 protrude outwardly through the openings 16 of the resin case 15. A bolt hole 13c is formed on the upper surface portion 13a. Between the two side surface portions 13b of the main terminals 13, a nut case 19 is inserted. The nut case 19 is a resin body in which nuts 191 for connecting an external wiring to the main terminals 13 are housed. In the illustrated nut case 19, three nuts 191 corresponding to the three main terminals 13 are linearly arranged at the same intervals as those of the main terminals 13. The nuts 191 in the nut case 19 are aligned with the respective main terminals 13. Connection between the main terminals 13 and the external wiring is established by screw-connecting a bolt or screw (not shown) to each nut 191 in the nut case 19 through the bolt hole 13c of each main terminal 13.

Figure 1D:
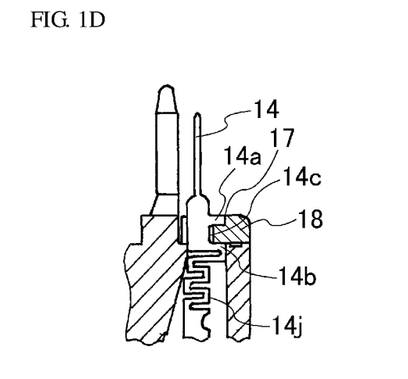

FIG. 1D is an enlarged view showing the vicinity of a region D of FIG. 1B. In the vicinity of the upper end of the control terminal 14 shown in FIG. 1D, the upper end of the control terminal 14 protrudes outwardly through the opening 17 of the resin case 15. The opening 17 is an opening whose range is determined by the resin block 18 attached to an opening 20 (see FIGS. 2A and 2B) of the resin case 15.

Each control terminal 14 has a first protrusion 14a and a second protrusion 14b, which are spaced from each other at positions corresponding to the multi-layered substrate 12 and the opening 17 of the resin case 15. Between the first protrusion 14a and the second protrusion 14b, a recess 14c is formed. The recess 14c interfits with a protrusion of the resin block 18 attached to the opening 20 of the resin case 15. Therefore, the control terminal 14 is precisely positioned in the horizontal direction, that is, in the direction parallel to the in-plane direction of the front surface of the heat-dissipating base 11, and movement of the control terminal 14 in the vertical direction caused by an external load is inhibited.

Figure 2A:
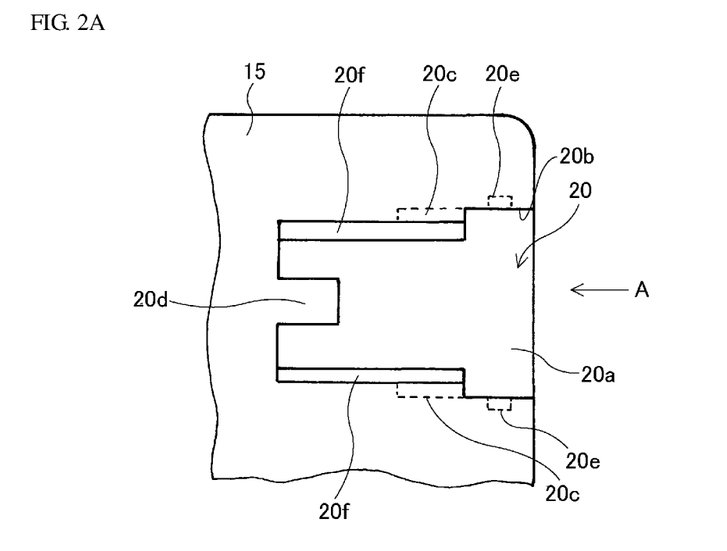
FIGS. 2A and 2B are enlarged views showing the vicinity of the opening of the resin case.
Figure 2B:
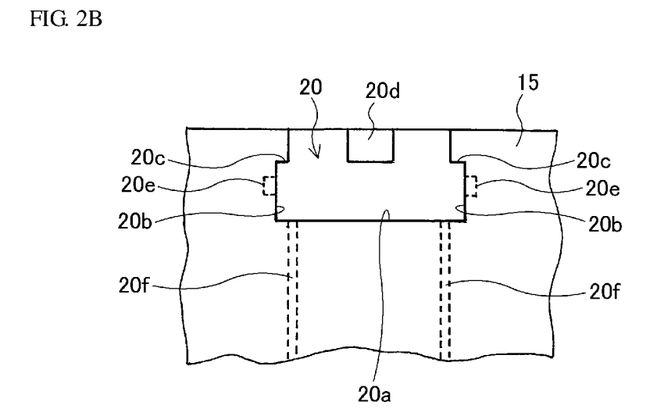

FIG. 2A is an enlarged view showing the vicinity of the opening 20 of the resin case 15 shown in FIG. 1A, and FIG. 2B is a back view of the opening 20 taken from the side of the arrow A. The opening 20 of the resin case 15 is an opening which connects the upper and side surfaces of the resin case 15. A beam portion 20a constitutes the bottom part of this opening 20. On the upper side of side walls 20b formed on each side of the opening 20, convex first eaves (first steps) 20c which protrude from each side wall 20b toward the inside of the opening 20 are formed.

On a front side wall of the opening 20, a convex second eave (step) 20d which protrudes toward the inside of the opening 20 is formed. The "front side wall" of the opening 20 refers to a side wall which faces the mouth of the opening 20 on the side surface side. The front side wall lies adjacent to the two opposing side walls 20b. Further, on each side wall 20b on both sides of the opening 20, a first recess 20e is formed toward the outside of the opening 20. The first recess 20e is arranged away from the respective first eaves 20c. In the beam portion 20a, through-holes 20f which the control terminals 14 pass through are formed.

Figure 3A:
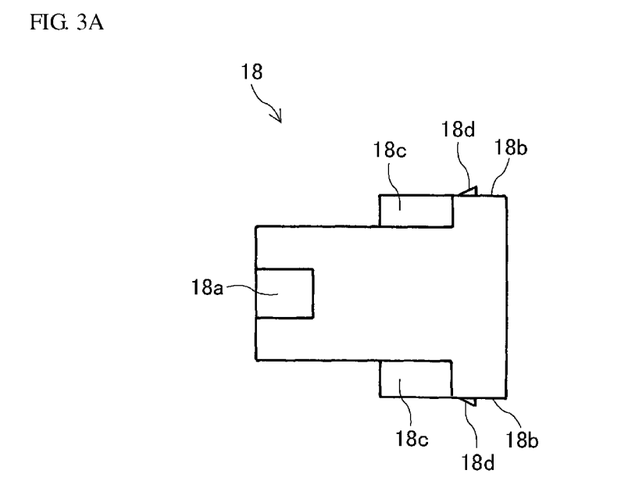
FIGS. 3A to 3C are drawings that illustrate the resin block.
Figure 3B:
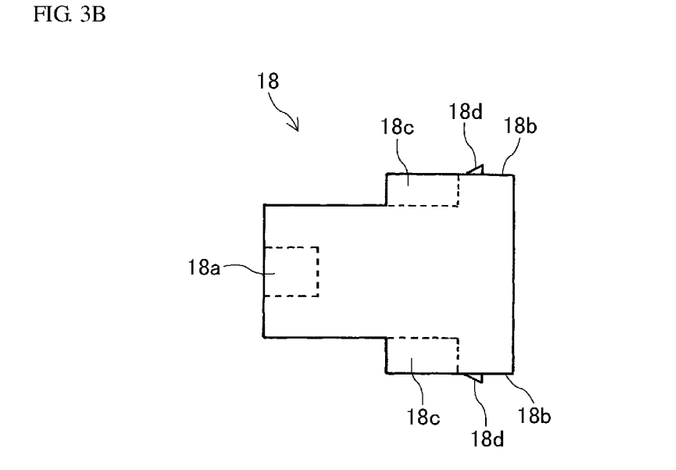
Figure 3C:
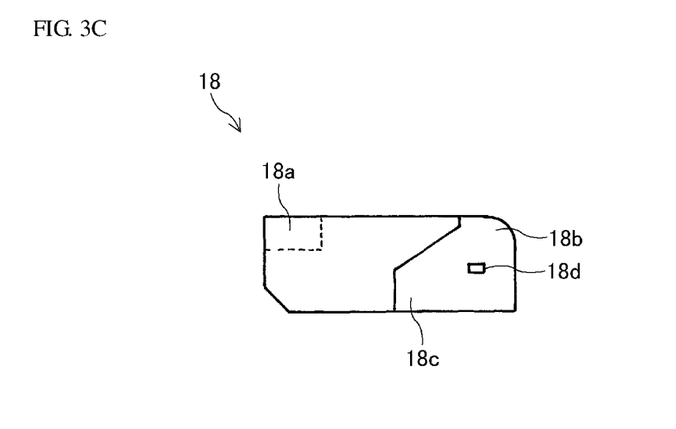

FIGS. 3A to 3C show the resin block 18. FIG. 3A is a top view of the resin block 18; FIG. 3B is a bottom view of the resin block 18; and FIG. 3C is a side view of the resin block 18. On the resin block 18, a groove 18a, which interfits with the second eave (step) 20d of the opening 20 of the resin case 15, is formed. On each side surface 18b on both sides of the resin block 18, a step 18c, which has a convex shape and interfits with the recess 14c of each control terminal 14, is formed. Further, on each side surface 18b on both sides, a protrusion 18d, which interfits with the first recess 20e of the opening 20 of the resin case 15, is also formed.

Figure 4A:
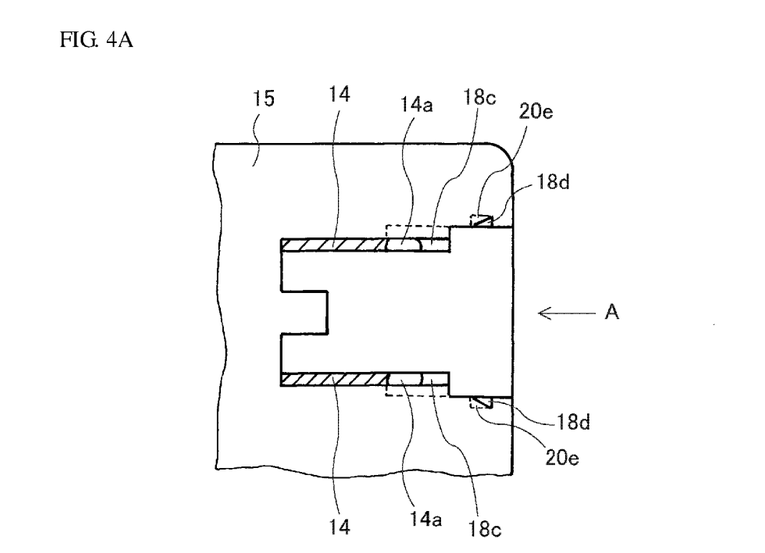
FIGS. 4A to 4C are assembly drawings of the resin case, the resin block and the control terminal.
Figure 4B:
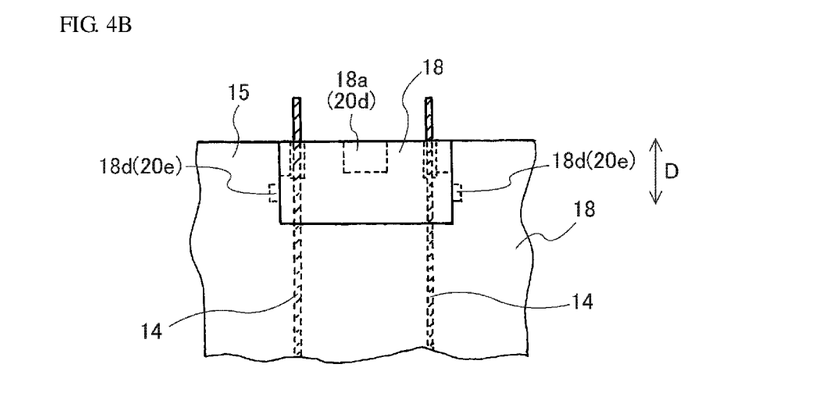
Figure 4C:
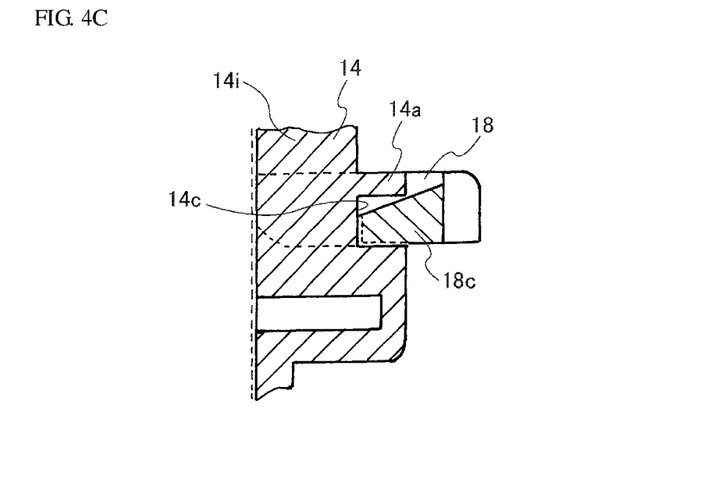

FIGS. 4A to 4C show a state where the control terminals 14 and the resin block 18 are inserted into the opening 20 of the resin case 15 shown in FIGS. 2A and 2B. FIG. 4A is a top view; FIG. 4B is a back view taken from the direction of the arrow A in FIG. 4A; and FIG. 4C is a partial cross-sectional view showing the engagement of the step 18c of the resin block 18 with the recess 14c between the first and second protrusions 14a and 14b of each control terminal 14. The resin block 18 can be inserted into the opening 20 in the direction of the arrow A.

A flat plate 14i of each control terminal 14 is sandwiched between the side wall 20b of the opening 20 of the resin case 15 and the side surface on the side of the tip of the resin block 18, whereby the position of the control terminal 14 is fixed in the direction perpendicular to the direction of the arrow A in the drawing. That is, the position of the control terminal 14 is fixed in the direction perpendicular to the flat plate 14i, which is the width direction of the resin case 15 that is perpendicular to the direction of inserting the resin block 18.

Further, the convex steps 18c on each side of the resin block 18 are fitted into each recess 14c between the first and second protrusions 14a and 14b of each control terminal 14, whereby the position of the control terminal 14 is fixed in the direction of the arrow A and the direction of the arrow D (FIG. 4B) in the drawings. That is, the position of the control terminal 14 is fixed in each of the lengthwise direction of the resin case 15 and the height direction of the resin case 15 that is perpendicular to the direction of inserting the resin block 18. In this manner, the control terminals 14 are precisely positioned and fixed.

Because of the steps 18c formed on each side, the resin block 18 can interfit with the recesses 14c of the control terminals 14 aligned with the respective steps 18c. Therefore, a single resin block 18 can interfit with and fix two control terminals 14. The protrusions 18d on the side surfaces of the resin block 18 each interfit with the first recess 20e formed in the opening 20 of the resin case 15, thereby fixing the resin block 18 in the opening 20 of the resin case 15. Alternatively, the resin block 18 can also be fixed in the opening 20 of the resin case 15 by dropping or applying an adhesive to the beam portion 20a of the opening 20 of the resin case 15.

Figure 5A:
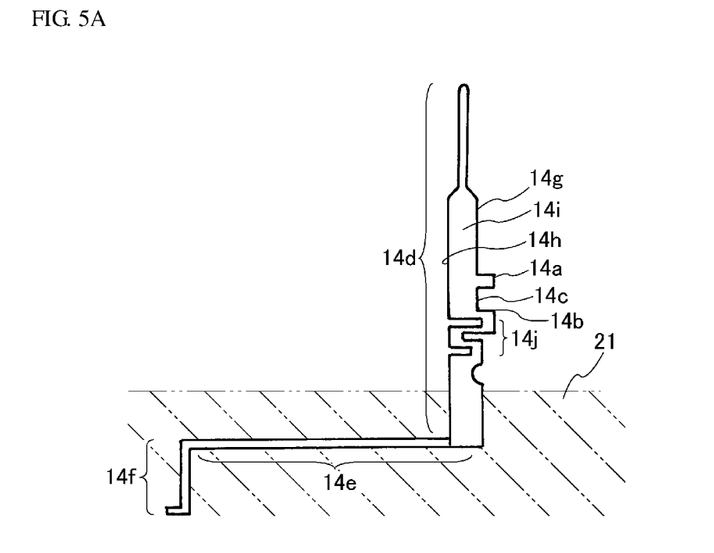
FIGS. 5A and 5B are drawings that illustrate the control terminal.
Figure 5B:
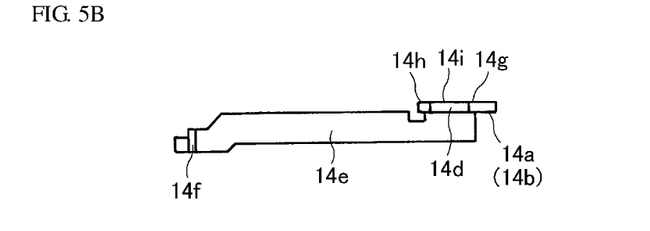
Figure 6:
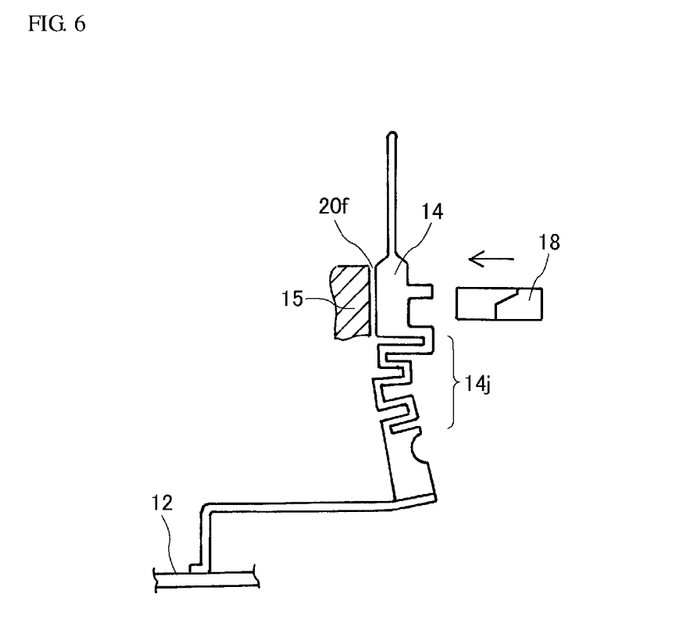
FIG. 6 is a drawing that illustrates the control terminal.

FIGS. 5A, 5B and 6 show the control terminal 14. FIG. 5A is a side view of the control terminal 14, and FIG. 5B is a top view of the control terminal 14. FIG. 6 shows a state where the control terminal 14, particularly a low-rigidity portion 14j, is deformed by the resin block 18 inserted into the opening 20 of the resin case 15. The control terminal 14 is produced by punching out a metal plate material into a prescribed shape and subsequently bending the thus punched-out metal plate material. As a result of this bending process, the control terminal 14 has three distinctive sections. The control terminal 14 has two ends, one of which is fixed on the circuit board 12c and the other of which extends to the outside of the resin case 15 through the opening 20. Specifically, the control terminal 14 comprises: an upright section 14d, which stands substantially upright with respect to the multi-layered substrate 12 and one of whose ends (tips) is exposed to the outside of the resin case 15; a connecting section 14e, which is connected to the other end of the upright section 14d in such a manner to form a substantially L-shape together with the upright section 14d; and a joint section 14f, which is bonded to the multi-layered substrate 12 and connected to an end of the connecting section 14e that is opposite to the end connected with the upright section 14d. In the illustrated example, the principal planes of the upright section 14d, connecting section 14e and joint section 14f are substantially perpendicular to each other. The line of intersection of the upright section 14d and the connecting section 14e is substantially perpendicular to the line of intersection of the connecting section 14e and the joint section 14f. The principal plane of the upright section 14d is substantially parallel to the insertion direction of the resin block 18.

The above-described first protrusion 14a, second protrusion 14b and recess 14c are formed on a side surface 14g on one side of the upright section 14d of the control terminal 14. A side surface 14h on the other side of the upright section 14d is in contact with the side wall of the through-hole 20f on the side of the front side wall of the opening 20 of the resin case 15. The part of the side wall of the through-hole 20f with which the side surface 14h of the control terminal 14 comes into contact serves as the reference plane for the position of the control terminal 14 in the longitudinal direction of the resin case 15.

The control terminal 14 comprises the low-rigidity portion 14j at a position in the upright section 14d that is closer to the connecting section 14e than the second protrusion 14b. In other words, the low-rigidity portion 14j is provided at a position that is in the part of the upright section 14d on the connecting section 14e side of the second protrusion 14b and further interior of the resin case 15 than the position where the upright section 14d is pressed by the resin block 18 in the opening 20 of the resin case 15. It is more preferred that the low-rigidity portion 14j be formed inside the resin case 15 of the power semiconductor module 10 at a position on the upper side of a sealing material 21 injected into the resin case 15.

The low-rigidity portion 14j has a zigzag shape with alternating notches as shown in FIG. 5A and is formed by, for example, partially notching the flat plate 14i of the upright section 14d in a substantially zigzag shape.

The effects of the low-rigidity portion 14j of the control terminal 14 will now be described in comparison with the conventional control terminals shown in FIGS. 8A to 8D and 9.

Figure 9:
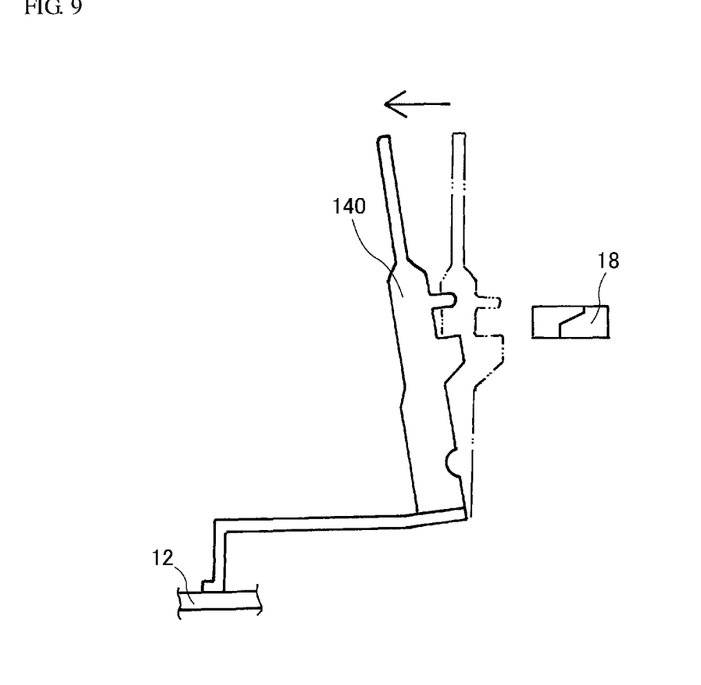
FIG. 9 is a drawing that illustrates a conventional control terminal.

FIG. 9 shows one example of the shape of a conventional control terminal 140. When the control terminal 140, whose lower end is bonded to the multi-layered substrate 12 and upper end is passed through an opening of a resin case, is press-fixed using the resin block 18, the upright section of the control terminal 140 is deformed at the base and thereby tilted, resulting in a reduction in the positional accuracy of the tip of the control terminal 140 in some cases.

The tilting of the upright section shown in FIG. 9 that leads to a reduction in the positional accuracy of the tip of the conventional control terminal 140 is caused by factors such as variation in the position of bonding the control terminal 140 to the multi-layered substrate 12 and the component tolerance, clearance and the like between the resin case 15 and the control terminal 140. In addition, the longer the upright section and the connecting section of the control terminal 140 and the higher the rigidity of the upright section, the more likely the tilt of the upright section is to be large.

Further, in the conventional control terminal 140, for the formation of first protrusion 140a, second protrusion 140b and recess 140c, the flat surface of the upright section is arranged parallel to the longitudinal direction of the case as a necessity. Therefore, the rigidity in the direction from one side surface to the other side surface, that is, the rigidity in the direction parallel to the longitudinal direction of the case, is higher than the rigidity in the direction perpendicular to the flat plate surface, that is, the rigidity in the direction perpendicular to the longitudinal direction of the case. Accordingly, even if a pressure is applied by the resin block 18 from one side surface toward the other side surface of the upright section of the control terminal 140, the upright section is hardly deformed but deformation occurs in the portion where the upright section and the connecting section are connected, and this results in tilting of the upright section.

In contrast, in the control terminal 14 of the semiconductor device of this embodiment, the low-rigidity portion 14j is provided in the upright section 14d. As a result, even with the principal plane of the upright section 14d and that of the connecting section 14e being substantially perpendicular to each other and the principal plane of the upright section 14d and the insertion direction of the resin block 18 being substantially parallel to each other, when the resin block 18 is fitted to the opening 20 of the resin case 15 and pressed in the direction from one side surface 14g to the other side surface 14h of the upright section 14d of the control terminal 14, the control terminal 14 is bent and thus deformed in the low-rigidity portion 14j as shown in FIG. 6, allowing the tip side of the upright section 14d to be parallel to the reference plane.

Accordingly, even in a case where tilting of the upright section 14d can occur due to the factors such as variation in the position of bonding the joint section 14f of the control terminal 14 to the multi-layered substrate 12 and the component tolerance, clearance and the like between the resin case 15 and the control terminal 14, the low-rigidity portion 14j is bent by a pressure applied at the time of fitting the resin block 18 to the resin case 15. Since this consequently allows the side surface 14h of the upright section 14d to tightly adhere parallel to the side wall of the through-hole 20f, tilting of the control terminal 14 is inhibited on the tip side of the low-rigidity portion 14j, so that a high positional accuracy can be ensured.

In the upright section 14d, the low-rigidity portion 14j is provided on the connecting section 14e side of the second protrusion 14b at a position near the connecting section 14e. This position is preferably closer to the tip than the sealing material 21 injected into the resin case 15. In other words, it is preferred that the control terminal 14 comprise the low-rigidity portion 14j between the second protrusion 14b and the sealing material 21. When the low-rigidity portion 14j is positioned in the sealing material 21, cracking and the like of the sealing material 21 may occur during deformation of the low-rigidity portion 14j and the voltage resistance characteristics may thus be impaired.

Since the connecting section 14e of the control terminal 14 may be immersed in the sealing material 21 inside the resin case 15, in order to avoid cracking of the sealing material 21, it is preferred not to arrange the low-rigidity portion 14j in the connecting section 14e.

The rigidity of the low-rigidity portion 14j may be set at such a level that allows the low-rigidity portion 14j to be bent by a pressure applied thereto at the time of fitting the resin block 18 to the resin case 15. The low-rigidity portion 14j is preferably less rigid than the plate-form connecting section 14e and/or the joint section 14f, at such a level that allows the low-rigidity portion 14j to be deformed preferentially to the connecting section 14e and the joint section 14f by a force applied thereto at the time of inserting the resin block 18. It is noted here, however, that an excessively low rigidity makes the control terminal 14 unsteady during the assembly of the power semiconductor module and may instead reduce the positional accuracy. The rigidity of the low-rigidity portion 14j can be adjusted by changing the number of the notches constituting the substantially zigzag shape and the thickness of wire material. Further, it is more preferred to adjust the number of the notches such that the low-rigidity portion 14j is deformed and bent to the same extent in both the direction of the force applied by the resin block 18 and the opposite direction thereof, because this enables to position the tip of the upright section 14d even when the joint section 14f is not properly positioned on either side of the longitudinal direction of the power semiconductor module 10. For example, the number of the notches is preferably an even number.

The shape of the low-rigidity portion 14j is not restricted to the substantially zigzag shape shown in FIG. 5A and may be any shape as long as the low-rigidity portion 14j can be deformed preferentially to other parts of the upright section 14d. For example, the low-rigidity portion 14j can take an S-shape or a U-shape.

Embodiment 2

Figure 7A:
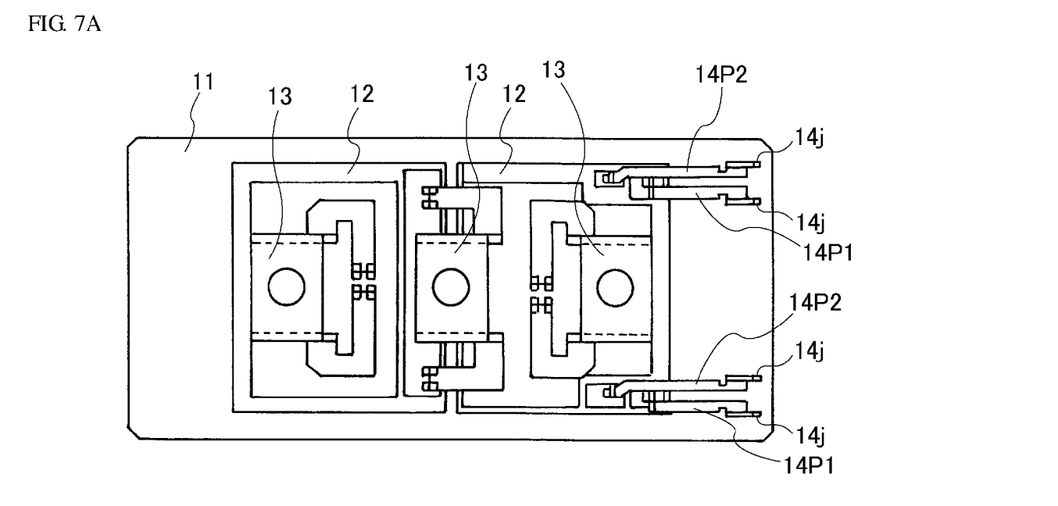
FIGS. 7A and 7B are drawings that illustrate the control terminal.
Figure 7B:
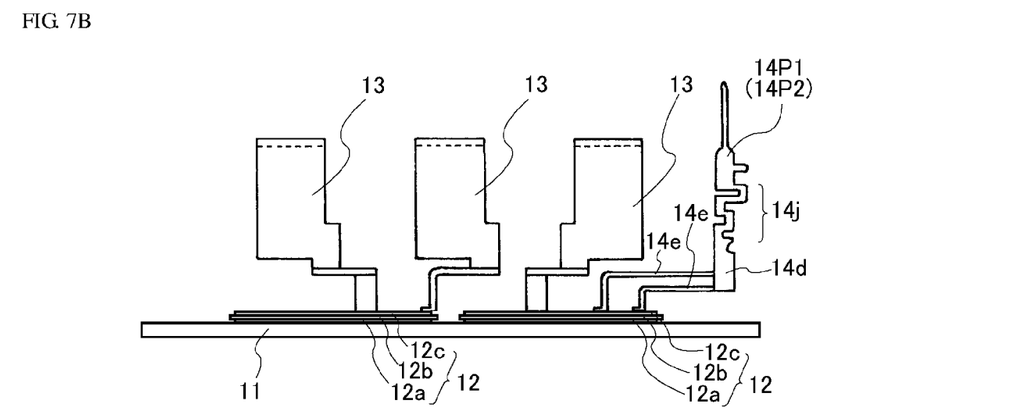

The resin block 18 shown in FIGS. 3A to 3C comprises the step 18c on both side surfaces 18b and is capable of interfitting with and fixing two control terminals 14. FIGS. 7A and 7B shows a plan view (FIG. 7A) and a side view (FIG. 7B) of the main terminals 13 and the control terminals 14 that are bonded to the multi-layered substrates 12. Two control terminals 14P1 and 14P2, which are fixed by a single resin block 18 and constitute a single set, are bonded in non-contact with each other on different circuit boards of the multi-layered substrate 12; therefore, the lengths of the upright section 14d and the connecting section 14e are different between these control terminals. For example, one of the control terminals 14P1 and 14P2 is for gating and the other is for source-sensing. Even with the control terminals 14P1 and 14P2 having different lengths in the upright section 14d and the connecting section 14e, a high positional accuracy can be attained by adjusting their low-rigidity portions 14j in such a manner to be deformed to the same extent when pressed by the resin block 18.

Therefore, in a preferred mode of the control terminals 14P1 and 14P2, when the two control terminals 14P1 and 14P2 having different shapes as in the lengths of the upright section 14d and the connecting section 14e are fixed by a single resin block 18, their low-rigidity portions 14j are provided with ease of bending that varies in accordance with the difference in the shapes of the control terminals 14P1 and 14P2. Consequently, the low-rigidity portions of the control terminals 14P1 and 14P2 are deformed to the same extent due to a pressure applied by the resin block 18. The term "ease of bending" used herein refers to the ease of bending in the longitudinal direction of a resin case, that is, in the direction of inserting the resin block 18 to the opening 20 of the resin case 15. Examples of a specific means for allowing the low-rigidity portions 14j to be different in ease of bending include varying the number, width and/or the like of notches that yield a zigzag shape when the low-rigidity portions 14j have a substantially zigzag shape. For instance, in a case where the connecting section 14e of the control terminal 14P2 is longer than that of the control terminal 14P1 as shown in the drawing, it is preferred that the low-rigidity portion 14j of the control terminal 14P2 be less rigid than the low-rigidity portion 14j of the control terminal 14P1. Since the connecting section 14e of the control terminal 14P2 is more easily bent by an external force (less rigid), positioning of the tips of the control terminals 14P1 and 14P2 is made easy by making the low-rigidity portion 14j of the control terminal 14P2 more readily deformable than that of the control terminal 14P1. In order to make the low-rigidity portion 14j of the control terminal 14P2 more readily deformable than that of the control terminal 14P1, for example, the low-rigidity portion 14j of the control terminal 14P2 may be allowed to have a greater number or a greater width of notches than that of the control terminal 14P1, or a thinner wire material may be used for the low-rigidity portion 14j of the control terminal 14P2.

In the above, the semiconductor device of the present invention has been concretely described referring to the drawings and embodiments; however, the present invention is not restricted to the above descriptions of embodiments and drawings, and various modifications can be made within the scope that does not depart from the spirit of the present invention.

DESCRIPTION OF SYMBOLS 10 power semiconductor module
12 multi-layered substrate
13 main terminal
14 control terminal
14a first protrusion
14b second protrusion
14c recess
14j low-rigidity portion
15 resin case
18 resin block

The invention claimed is:
1. A semiconductor device comprising:
a multi-layered substrate which comprises a circuit board;
a control terminal which has an end on one side and the other end on the other side, said end on one side being fixed on said circuit board of said multi-layered substrate;
a resin case which has an opening and is arranged to cover said multi-layered substrate, through which opening said other end of said control terminal extends outwardly; and
a resin block which is inserted into said opening of said resin case and press-fixes said control terminal against a side wall of said opening,
wherein said control terminal comprises a low-rigidity portion at a position that is further interior of said resin case than a position where said control terminal is in contact with said resin block in said opening of said resin case, and
said low-rigidity portion of said control terminal is positioned closer to said opening of said resin case than a sealing material injected into said resin case.
2. The semiconductor device according to claim 1, wherein
said control terminal comprises a first protrusion, a second protrusion and a recess between said first and second protrusions, and
said recess interfits with said resin block.
3. The semiconductor device according to claim 1, wherein said low-rigidity portion of said control terminal has a substantially zigzag shape.
4. A semiconductor device comprising:
a multi-layered substrate which comprises a circuit board;
a control terminal which has an end on one side and the other end on the other side, said end on one side being fixed on said circuit board of said multi-layered substrate;
a resin case which has an opening and is arranged to cover said multi-layered substrate, through which opening said other end of said control terminal extends outwardly; and
a resin block which is inserted into said opening of said resin case and press-fixes said control terminal against a side wall of said opening,
wherein said control terminal comprises a low-rigidity portion at a position that is further interior of said resin case than a position where said control terminal is in contact with said resin block in said opening of said resin case,
said resin block fixes two control terminals which constitute a single set,
said control terminals which constitute the single set are different in shape and have varying ease of bending in their low-rigidity portions in accordance with said difference in shape, and
said low-rigidity portions of said control terminals can be deformed to a same extent by a pressure applied thereto by said resin block.
5. The semiconductor device according to claim 4, wherein
said at least one control terminal comprises a first protrusion, a second protrusion and a recess between said first and second protrusions, and
said recess interfits with said resin block.
6. The semiconductor device according to claim 4, wherein each low-rigidity portion of said control terminals has a substantially zigzag shape.

* * * * *